US012615876B2

(12) United States Patent
Sawada et al.

(10) Patent No.: US 12,615,876 B2
(45) Date of Patent: Apr. 28, 2026

(54) METHOD FOR PRODUCING SOLAR CELL STRING, AND SOLAR CELL STRING

(71) Applicant: KANEKA CORPORATION, Osaka (JP)

(72) Inventors: Toru Sawada, Osaka (JP); Satoshi Akaike, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 18/848,852

(22) PCT Filed: Mar. 22, 2023

(86) PCT No.: PCT/JP2023/011203
§ 371 (c)(1),
(2) Date: Sep. 19, 2024

(87) PCT Pub. No.: WO2023/182352
PCT Pub. Date: Sep. 28, 2023

(65) Prior Publication Data
US 2025/0204081 A1     Jun. 19, 2025

(30) Foreign Application Priority Data

Mar. 23, 2022     (JP) ................................. 2022-046760

(51) Int. Cl.
*H10F 77/20*          (2025.01)
*H10F 19/90*          (2025.01)
(52) U.S. Cl.
CPC ......... *H10F 77/215* (2025.01); *H10F 19/902* (2025.01)
(58) Field of Classification Search
CPC ...... H10F 77/215; H10F 19/902; H10F 19/00; H10F 19/904; H10F 19/90; H10F 77/20; Y02E 10/50
See application file for complete search history.

(56) References Cited

U.S. PATENT DOCUMENTS

2017/0125619 A1     5/2017   Nakano et al.
2017/0301801 A1*   10/2017   Nguyen ................ H10F 77/244
(Continued)

FOREIGN PATENT DOCUMENTS

CN          108899387 A     11/2018
CN          109326665 A      2/2019
(Continued)

OTHER PUBLICATIONS

"Notice of Reasons for Refusal" Office Action issued in JP 2024-509161; mailed by the Japanese Patent Office on Jun. 6, 2025.
(Continued)

*Primary Examiner* — Niki Bakhtiari
(74) *Attorney, Agent, or Firm* — Studebaker Brackett PLLC

(57)                    ABSTRACT

Provided is a method for producing a solar cell string including: preparing a plurality of small cell pieces by forming a first collector electrode by applying a first collector electrode material including a first metal component and a first resin component to one surface of a semiconductor substrate and curing the first collector electrode material, and forming a second collector electrode by applying a second collector electrode material including a second metal component and a second resin component softer than the first resin component to an other surface of the semiconductor substrate and leaving the second collector electrode material uncured; and curing the second collector electrode material after the first collector electrode of one of each two adjacent small cell pieces and the second collector electrode of an other one of each two adjacent small cell pieces overlap each other.

5 Claims, 9 Drawing Sheets

(56)            References Cited

U.S. PATENT DOCUMENTS

| | | |
|---|---|---|
| 2018/0366596 A1 | 12/2018 | Chang et al. |
| 2022/0271190 A1 | 8/2022 | Jeong et al. |

FOREIGN PATENT DOCUMENTS

| | | |
|---|---|---|
| CN | 112234108 A | 1/2021 |
| CN | 112864257 A | 5/2021 |
| JP | 2000-101152 A | 4/2000 |
| JP | 2009-252975 A | 10/2009 |
| JP | 2010-238938 A | 10/2010 |
| JP | 2014-069426 A | 4/2014 |
| JP | 2015-053342 A | 3/2015 |
| JP | 2019-004135 A | 1/2019 |
| JP | 6586080 B2 | 10/2019 |
| JP | 2022-025933 A | 2/2022 |
| KR | 10-2021-0014317 A | 2/2021 |
| WO | 2021/020657 A1 | 2/2021 |

OTHER PUBLICATIONS

International Search Report issued in PCT/JP2023/011203; mailed Jun. 6, 2023.
International Preliminary Report on Patentability (Chapter I) and Written Opinion of the International Searching Authority; PCT/JP2023/011203; mailed on Oct. 3, 2024.
An Office Action, "Notice of Reasons for Refusal," mailed by the Japanese Patent Office on Oct. 10, 2025, which corresponds to Japanese Patent Application No. 2024-509161 and is related to U.S. Appl. No. 18/848,852; with English language translation.

* cited by examiner

Fig.4C

METHOD FOR PRODUCING SOLAR CELL STRING, AND SOLAR CELL STRING

CROSS-REFERENCE TO RELATED APPLICATION

This application claims priority to Japanese Patent Application No. 2022-046760, the disclosure of which is incorporated herein by reference in its entirety.

FIELD

The present invention relates to a method for producing a solar cell string obtained by so-called shingling connection, in which a plurality of solar cells are electrically connected to each other only via a conductive member without use of a wiring member such as a tab wire; and relates to a solar cell string.

BACKGROUND

A solar cell generally has a substantially rectangular plane shape. On a light-receiving surface of the solar cell, a plurality of front-side finger electrodes each extending in a short-side direction of the solar cell are formed by application at intervals from each other along a long-side direction thereof, and a front-side bus bar electrode configured to collect electric current collected by the plurality of finger electrodes is formed by application and then cured in one end part in the short-side direction of the solar cell to extend in the long-side direction thereof. On a back surface opposite to the light-receiving surface of the solar cell, similarly, a plurality of back-side finger electrodes each extending in the short-side direction are formed by application at intervals from each other along the long-side direction, and a back-side bus bar electrode configured to collect electric current collected by the plurality of finger electrodes is formed by application and then cured in the other end part in the short-side direction to extend in the long-side direction. A plurality of the solar cells each including the electrodes respectively on both the front and back surfaces as described above are prepared, and the back-side bus bar electrode of one solar cell and the front-side bus bar electrode of the other solar cell between each two adjacent ones of the plurality of solar cells are overlapped with each other with a conductive member therebetween. The overlapped solar cells are subjected to pressure and heating to bring the back-side bus bar electrode of the one solar cell and the front-side bus bar electrode of the other solar cell into contact with the conductive member for their electrical connection, thereby completing the connection of the solar cells. A solar cell string composed of the plurality of solar cells is thus formed (produced) (see, for example, Patent Literature 1).

The method of Patent Literature 1 in which the back-side bus bar electrode and the front-side bus bar electrode are connected to each other using the conductive member is more excellent in productivity than in the case where those electrodes are connected using a tab wire, but a method further excellent in productivity has been demanded.

CITATION LIST

Patent Literature

Patent Literature 1: JP 6586080 B

SUMMARY

Technical Problem

In view of such circumstances, therefore, it is an object of the present invention to provide a method for producing a solar cell string excellent in productivity and capable of increasing adhesive force between electrodes.

Solution to Problem

A method for producing a solar cell string according to the present invention includes:

preparing a plurality of small cell pieces by forming a first collector electrode by applying a first collector electrode material including a first metal component and a first resin component to one surface of a semiconductor substrate and curing the first collector electrode material, and forming a second collector electrode by applying a second collector electrode material including a second metal component and a second resin component softer than the first resin component to an other surface of the semiconductor substrate and leaving the second collector electrode material uncured; and curing the second collector electrode material after each two adjacent ones of the plurality of small cell pieces are partially overlapped with each other to allow the first collector electrode of one of each two adjacent small cell pieces to overlap the second collector electrode of an other one of each two adjacent small cell pieces.

The method for producing the solar cell string can further include: forming a plurality of the first collector electrodes on the one surface of the semiconductor substrate;

forming at least one dividing line on the semiconductor substrate on which the plurality of first collector electrodes are formed;

dividing the semiconductor substrate into the plurality of small cell pieces by cutting the semiconductor substrate along the at least one dividing line;

forming the second collector electrode on the other surface opposite to the one surface of each of the plurality of small cell pieces formed by the dividing, the one surface having a corresponding one of the plurality of first collector electrodes formed thereon;

overlapping the first collector electrode of the one of each two adjacent small cell pieces with the second collector electrode of the other one of each two adjacent small cell pieces out of the plurality of small cell pieces each having the first collector electrode and the second collector electrode formed thereon; and curing the second collector electrode material after the overlapping.

In the method for producing the solar cell string, the configuration can be such that the semiconductor substrate has a substantially quadrangular shape having a pair of opposite sides, the at least one dividing line is a linear groove formed substantially parallel to the pair of opposite sides of the semiconductor substrate, each of the first collector electrode and the second collector electrode includes a bus bar electrode, the forming of the plurality of first collector electrodes includes forming the bus bar electrode of each of the plurality of first collector electrodes on the one surface of each of the plurality of small cell pieces to be divided, at a position close to one side of the pair of opposite sides, the forming of the second collector electrode includes forming the bus bar electrode of the second collector electrode on the other surface of each of the plurality of divided small cell pieces, at a position close to an other one side opposite to the one side of the pair of opposite sides, and the overlapping of the first collector electrode with the second collector electrode is overlapping of the bus bar electrode of the first collector electrode with the bus bar electrode of the second collector electrode.

In the method for producing the solar cell string, the configuration can be such that the first collector electrode is formed to have a substantially linear shape on a front surface being a light-receiving surface of the semiconductor substrate, the first resin component of the first collector electrode material includes an epoxy resin as a main component, the second collector electrode is formed to have a substantially linear shape on a back surface opposite to the light-receiving surface of the semiconductor substrate, the second resin component of the second collector electrode material includes an acrylic resin as a main component, and the first collector electrode has a line width smaller than the line width of the second collector electrode.

The method for producing the solar cell string can further include:

attaching a transparent synthetic resin to the plurality of overlapped small cell pieces before curing the second collector electrode material, so as to extend over the plurality of small cell pieces.

BRIEF DESCRIPTION OF DRAWINGS

FIG. 4C is a schematic view showing a state where a first collector electrode bites into a second collector electrode.

DESCRIPTION OF EMBODIMENTS

Figure 1A:
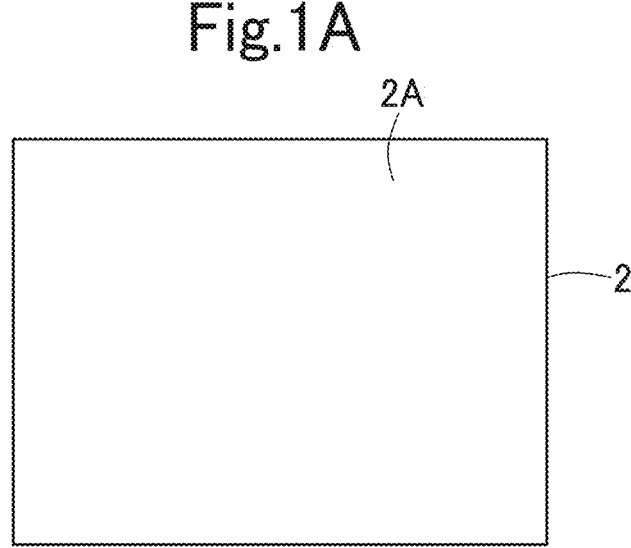
FIG. 1A is a plan view of a semiconductor substrate.

A method for producing a solar cell string according to the present invention includes: preparing a plurality of small cell pieces by forming a first collector electrode by applying a first collector electrode material including a first metal component and a first resin component to one surface of a semiconductor substrate and curing the first collector electrode material, and forming a second collector electrode by applying a second collector electrode material including a second metal component and a second resin component softer than the first resin component to an other surface of the semiconductor substrate and leaving the second collector electrode material uncured;

and curing the second collector electrode material after each two adjacent ones of the plurality of small cell pieces are partially overlapped with each other to allow the first collector electrode of one of each two adjacent small cell pieces to overlap the second collector electrode of an other one of each two adjacent small cell pieces.

According to such a configuration, the first collector electrode and the second collector electrode are electrically connected to each other simply by allowing both end parts of each two adjacent ones of the plurality of small cell pieces to overlap each other so as to bring the first collector electrode of the one of each two adjacent small cell pieces and the second collector electrode of the other one of each two adjacent small cell pieces into overlapping each other, followed by curing the uncured second collector electrode material. This configuration eliminates the necessity of disposing a different conductive member from the first or second collector electrode between the first collector electrode and the second collector electrode, thus achieving excellent productivity. Further, the configuration that the second resin component of the second collector electrode made of the second collector electrode material applied and left uncured is a resin component softer than the first resin component of the first collector electrode enables the first collector electrode made of the cured first collector electrode material to easily bite into the softer second collector electrode made of the uncured second collector electrode material, thus achieving an increased adhesive force between the first collector electrode and the second collector electrode.

The method for producing the solar cell string can further include: forming a plurality of the first collector electrodes on the one surface of the semiconductor substrate; forming at least one dividing line on the semiconductor substrate on which the plurality of first collector electrodes are formed; dividing the semiconductor substrate into the plurality of small cell pieces by cutting the semiconductor substrate along the at least one dividing line; forming the second collector electrode on the other surface opposite to the one surface of each of the plurality of small cell pieces formed by the dividing, the one surface having a corresponding one of the plurality of first collector electrodes formed thereon;

overlapping the first collector electrode of the one of each two adjacent small cell pieces with the second collector electrode of the other one of each two adjacent small cell pieces out of the plurality of small cell pieces each having the first collector electrode and the second collector electrode formed thereon; and curing the second collector electrode material after the overlapping.

As described above, the at least one dividing line is formed on the semiconductor substrate after the plurality of first collector electrodes are formed on the one surface of the semiconductor substrate. Next, the semiconductor substrate is divided into the plurality of small cell pieces by being cut along the dividing line. The second collector electrode is made with the second collector electrode material left uncured on the other surface opposite to the one surface of each of the divided small cell pieces with a corresponding one of the plurality of first collector electrodes formed on the one surface, and thereafter the first collector electrode of the one small cell piece and the second collector electrode of the other small cell piece of each two adjacent ones of the plurality of small cell pieces are overlapped with each other. After this overlapping, the second collector electrode material is cured.

In the method for producing the solar cell string, the configuration can be such that the semiconductor substrate has a substantially quadrangular shape having a pair of opposite sides, the at least one dividing line is a linear groove formed substantially parallel to the pair of opposite sides of the semiconductor substrate, each of the first collector electrode and the second collector electrode includes a bus bar electrode, the forming of the plurality of first collector electrodes includes forming the bus bar electrode of each of the plurality of first collector electrodes on the one surface of each of the plurality of small cell pieces to be divided, at a position close to one side of the pair of opposite sides, the forming of the second collector electrode includes forming the bus bar electrode of the second collector electrode on the other surface of each of the plurality of divided small cell pieces, at a position close to an other one side opposite to the one side of the pair of opposite sides, and the overlapping of the first collector electrode with the second collector electrode is overlapping of the bus bar electrode of the first collector electrode with the bus bar electrode of the second collector electrode.

The above configuration that the bus bar electrode of the second collector electrode formed on the other surface at a position close to the other one side of the pair of opposite sides and the bus bar electrode of the first collector electrode formed on the one surface at a position close to the one side of the pair of opposite sides are connected to each other, i.e., connected by shingling, can increase output per unit area of the solar cell string formed of the plurality of small cell pieces connected to each other.

In the method for producing the solar cell string, the configuration can be such that the first collector electrode is formed to have a substantially linear shape on a front surface being a light-receiving surface of the semiconductor substrate, the first resin component of the first collector electrode material includes an epoxy resin as a main component, the second collector electrode is formed to have a substantially linear shape on a back surface opposite to the light-receiving surface of the semiconductor substrate, the second resin component of the second collector electrode material includes an acrylic resin as a main component, and the first collector electrode has a line width smaller than the line width of the second collector electrode.

The above configuration that the synthetic resin component of the first collector electrode material of the first collector electrode formed on the front surface being the light-receiving surface is made mainly of an epoxy resin that is a hard resin can increase shape retainability of the first collector electrode and form the first collector electrode to have a smaller line width than that of the second collector electrode. This configuration can more effectively utilize the sunlight with which the light-receiving surface is irradiated, thereby being capable of increasing power generation efficiency of the second collector electrode. Further, the configuration that the synthetic resin component of the second collector electrode material is made mainly of an acrylic resin that is a soft resin not only enables an increased adhesive force between the first collector electrode and the second collector electrode, but also keeps the second collector electrode material flexible even after being cured, to thereby enable favorable absorption of the external force generated in the connection part between the first collector electrode and the second collector electrode resulting from, for example, temperature changes or vibrations.

The method for producing the solar cell string can further include: attaching a transparent synthetic resin to the plurality of overlapped small cell pieces before curing the second collector electrode material, so as to extend over the plurality of small cell pieces.

The above configuration that the transparent synthetic resin is attached to the plurality of overlapped small cell pieces so as to extend over the plurality of small cell pieces can reinforce the connection of the small cell pieces without reducing the amount of light received by the light-receiving surface.

A solar cell string according to the present invention includes:

a plurality of small cell pieces each including a semiconductor substrate, a first collector electrode disposed on one surface of the semiconductor substrate, and a second collector electrode disposed on an other surface of the semiconductor substrate, in which the plurality of small cell pieces are arranged in a certain direction in a state of being partially overlapped with each other to allow the first collector electrode of one small cell piece to overlap the second collector electrode of an other small cell piece of each two adjacent small cell pieces, and the first collector electrode bites into the second collector electrode in a portion where the first collector electrode and the second collector electrode of each two adjacent small cell pieces overlap each other.

The above configuration that the first collector electrode and the second collector electrode are connected to each other in the state where the first collector electrode bites into the second collector electrode sufficiently secures the contact area between the first collector electrode and the second collector electrode, thereby sufficiently securing connection strength and conduction performance between the first collector electrode and the second collector electrode.

As described above, according to the present invention, the configuration that the first collector electrode and the second collector electrode are directly connected to each other and that the second resin component of the second collector electrode material is softer than the first resin component of the first collector electrode material achieves excellent productivity and an increased adhesive force between the electrodes.

Hereinafter, a solar cell string and a method for producing the solar string according to one embodiment of the present invention will be described with reference to the drawings.

A solar cell string 5 of this embodiment (see FIG. 4A) is formed (produced) by: forming a plurality of front-side collector electrodes 3 (see FIG. 1B) as first collector electrodes on a front surface 2A, which is one surface of a semiconductor substrate 2 (see FIG. 1A) having a substantially quadrangular shape and having an internal electric field formed through a pn junction; forming back-side collector electrodes 4 (see FIG. 3B) as second collector electrodes on a back surface 2B as the other surface, that is, on back surfaces 11b to 15b of divided small cell pieces 11 to 15 respectively as will be described later; and thereafter interconnecting the plurality of small cell pieces 11 to 15 with each other by shingling. The solar cell string 5 in FIG. 4A is illustrated without, e.g., a front-side protective member, a back-side protective member, and a sealant resin.

The semiconductor substrate 2 is formed of, for example, a thin slice in a transverse direction of a silicon single crystal ingot, the slice being subjected to, e.g., texture processing for an increased optical confinement effect and formation of an internal electric field through a pn junction on a front or back surface thereof. In this embodiment, the semiconductor substrate 2 is formed to have a substantially quadrangular shape (square shape or rectangular shape), but can have a different shape from these shapes. A description will be hereinafter made with a right-left direction defined based on a right-left direction of the paper surface in each of FIG. 1A to FIG. 3B, a front-back direction defined based on a top-bottom direction of the paper surface, and a vertical direction defined based on a direction extending to pass through the paper surface.

Figure 1B:
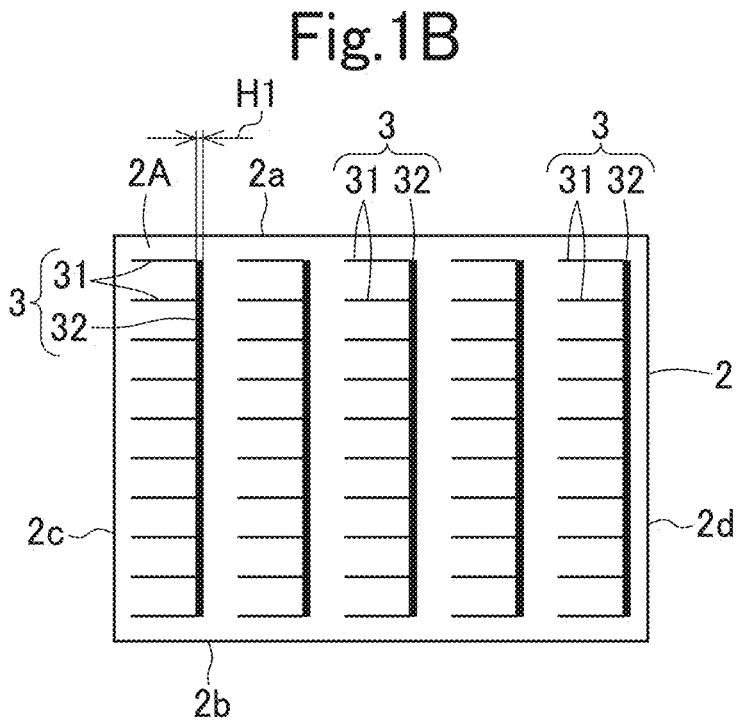
FIG. 1B is a view of the semiconductor substrate of FIG. 1A with its one surface having collector electrodes formed thereon.

As shown in FIG. 1B, the front-side collector electrodes 3 are formed respectively within segments obtained by dividing the front surface 2A of the semiconductor substrate 2 into five equal parts in the right-left direction. Each of the front-side collector electrodes 3 includes a plurality of (10 in FIG. 1B) front-side finger electrodes 31, and a front-side bus bar electrode 32 configured to collect electric current collected by the plurality of front-side finger electrodes 31. The plurality of front-side finger electrodes 31 each have a linear shape parallel to one pair of opposite sides 2a and 2b opposed to each other in the front-back direction out of four sides 2a, 2b, 2c, 2d of the semiconductor substrate 2, and are formed at regular intervals from each other in a direction along the pair of opposite sides 2c and 2d opposed to each other in the right-left direction (i.e., front-back direction). The front-side bus bar electrode 32 extends in a direction orthogonal to the front-side finger electrodes 31 (i.e., front-back direction) so as to connect one same ends (i.e., right ends in the right-left direction) in a longitudinal direction of the plurality of front-side finger electrodes 31. The front-side bus bar electrode 32 has a larger line width than that of each of the front-side finger electrodes 31.

Figures 3A, 3B:
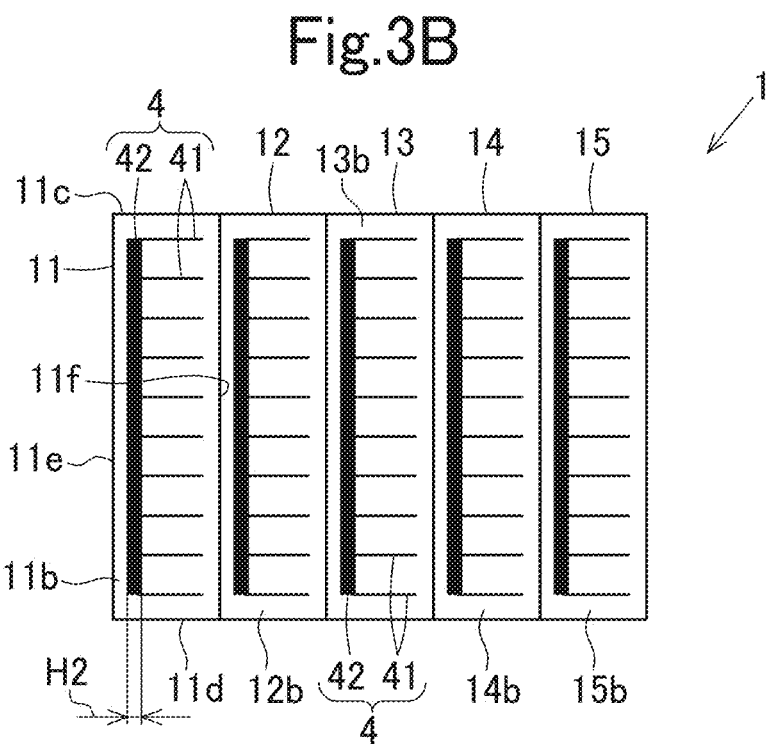
FIG. 3A is a bottom view of five small cell pieces obtained by cutting the semiconductor substrate along the scribe lines of FIG. 2B.
FIG. 3B is a plan view of the five small cell pieces assembled together, each having the other surface on which a collector electrode is formed.
Figure 4A:
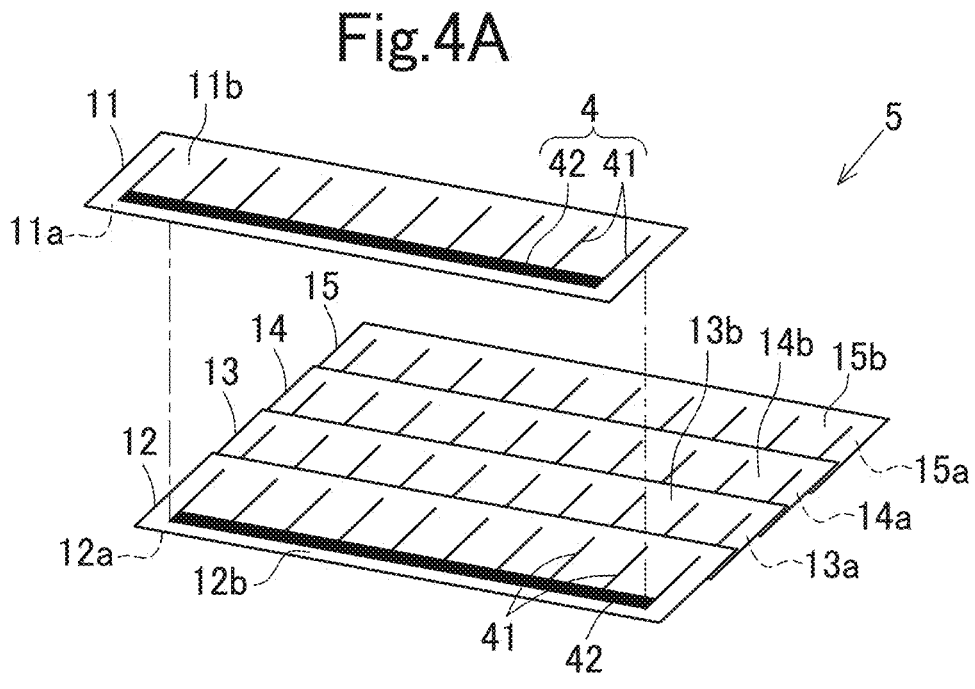
FIG. 4A is a perspective view showing a state immediately before overlapping the last one of the five small cell pieces.

As shown in FIG. 3B, the back-side collector electrodes 4 are formed respectively within back surfaces 11b to 15b of the divided small cell pieces 11 to 15 as will be described later. Each of the back-side collector electrodes 4 includes the plurality of (10 in FIG. 3B) back-side finger electrodes 41, and a back-side bus bar electrode 42 configured to collect electric current collected by the plurality of back-side finger electrodes 41. The plurality of back-side finger electrodes 41 of the small cell piece 11 each have a linear shape parallel to a pair of opposite sides 11c and 11d opposed to each other in the front-back direction out of four sides 11c, 11d, 11e, 11f of the small cell piece 11, and are formed at regular intervals from each other in a direction along a pair of opposite sides 11e and 11f opposed to each other in the right-left direction (i.e., front-back direction). The back-side bus bar electrode 42 of the small cell piece 11 extends in a direction orthogonal to the back-side finger electrodes 41 (i.e., front-back direction) so as to connect one same ends (i.e., left ends closer to the left side 11e; the opposite end to the front-side bus bar electrode 32 in plan view) in a longitudinal direction of the plurality of back-side finger electrodes 41. The same configuration is applicable to other small cell pieces 12 to 15, which have not been described. The back-side bus bar electrode 42 has a larger line width than that of each of the back-side finger electrodes 41.

The front-side collector electrode (first collector electrode) 3 on a side of a light-receiving surface is formed by applying a conductive metal paste into a desired shape by, for example, screen printing, followed by curing. The material of the metal paste (first collector electrode material) includes a first metal component including a metal such as silver as a main component (in this embodiment, the first metal component is identical to a second metal component to be described later, but can include a different metal component); and a first resin component including a synthetic resin. A specific description thereon will be given as follows.

For the first collector electrode material (metal paste) for forming the front-side collector electrodes 3, a mixture of conductive powder having a flake shape with its long side being 1 to 20 μm long and conductive spheres having a smaller diameter of 0.1 to 2 μm is used as the first metal component. Examples of the material of the first metal component include silver (Ag); and copper (Cu), nickel (Ni), or aluminum (Al) with its surface coated with silver (Ag).

The first resin component is made mainly of a thermosetting epoxy resin, which is a hard resin having a high shape retainability. This configuration enables the front-side collector electrodes 3, i.e., the front-side finger electrodes 31 and the front-side bus bar electrodes 32 to have a smaller linewidth than that of the back-side collector electrodes 4, i.e., the back-side finger electrodes 41 and the back-side bus bar electrodes 42, respectively. As a result, sunlight with which the light-receiving surface is irradiated can be used more effectively to increase power generation efficiency.

The first collector electrode material can include a curing agent and/or a solvent in addition to those above. In the first collector electrode material according to this embodiment, the weight ratio of the first resin component to the first metal component is 5 to 10 when the first metal component is 100.

The back-side collector electrodes (second collector electrodes) 4 on the back surface side are made of a conductive metal paste. The material of the metal paste (second collector electrode material) includes a second metal component including a metal such as silver as a main component; and a second resin component including a synthetic resin. A specific description thereon will be given as follows.

For the second collector electrode material (metal paste) for forming the back-side collector electrodes 4, a mixture of conductive powder having a flake shape with its long side being 1 to 20 μm long and conductive spheres having a smaller diameter of 0.1 to 2 μm is used as the second metal component. Examples of the material of the second metal component include silver (Ag); and copper (Cu), nickel (Ni), or aluminum (Al) with its surface coated with silver (Ag).

The second resin component is made mainly of a thermosetting resin such as a thermosetting acrylic resin (or can be a silicone resin), and can be made mainly of an acrylic, epoxy-based, or urethane-based ultraviolet-curing resin, or can be made mainly of a thermoplastic resin. When a thermoplastic resin is used, the thermoplastic resin is heated to a temperature at which the thermoplastic resin is softened, and temperature control is made to prevent the thermoplastic resin from being solidified until the front-side bus bar electrode 32 and the back-side bus bar electrode 42 are connected to each other. The configuration that the second resin component of the second collector electrode material is made mainly of an acrylic resin that is a soft resin not only enables an increased adhesive force between the front-side collector electrode 3 and the back-side collector electrode 4, but also keeps the second collector electrode material flexible even after being cured, to thereby enable favorable absorption of the external force generated in the connection part between the front-side collector electrode 3 and the back-side collector electrode 4 resulting from, for example, temperature changes or vibrations.

The second collector electrode material can include a curing agent and/or a solvent in addition to those above. In the second collector electrode material according to this embodiment, the weight ratio of the second resin component to the second metal component is 10 to 60 when the second metal component is 100. Thus, the configuration that the amount of the resin component relative to the metal component in the second collector electrode material is greater than the amount of the resin component relative to the metal component in the first collector electrode material allows the front-side bus bar electrodes32 of the front-side collector electrode 3 to easily bite into the back-side bus bar electrode 42 of the back-side collector electrode 4 before being cured.

Figure 5:
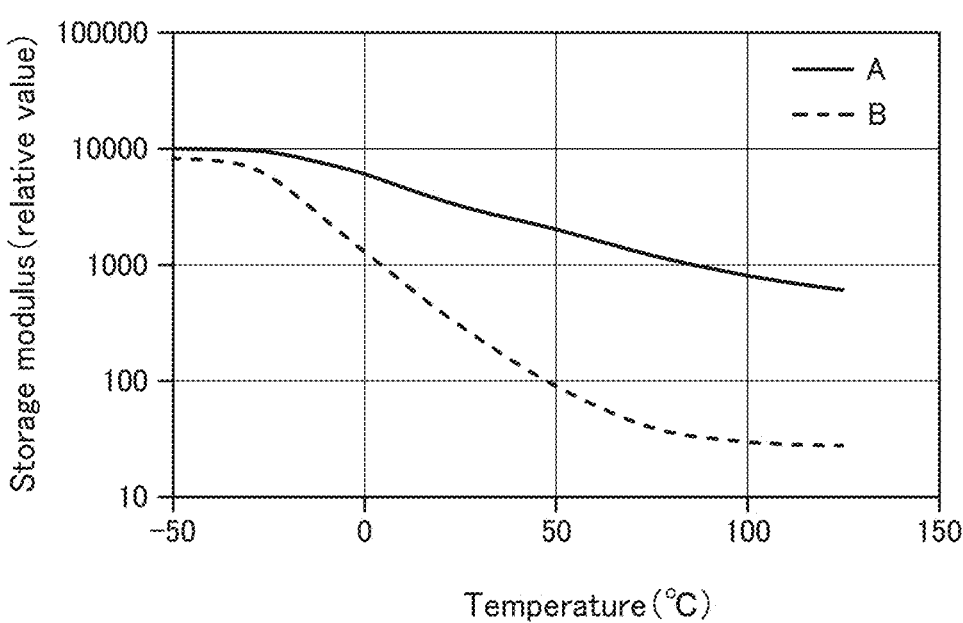
FIG. 5 is a view showing changes in storage moduli respectively of conductive pastes.

FIG. 5 is a schematic view showing the temperature characteristics of a storage modulus (relative value) E' of the second collector electrode material after being cured. The graph A shows that a change rate $\Delta E'/\Delta T$ of the storage modulus E' is kept small within a range of a temperature T in an acceleration test simulating outdoor exposure (temperature cycle test: −40° C. to 85° C.), indicating that the second collector electrode material is kept highly elastic. The graph B shows, on the other hand, that $\Delta E'/\Delta T$ is large in a certain range, in which the second collector electrode material significantly changes from the highly elastic to low elastic state at the glass transition point. Further, the solar cell string (shingling module) using the second collector electrode material having the characteristics represented by the graph A has better results in the acceleration test. During the temperature cycle, the small cell pieces are pulled in a direction of their series connection by a sealant having a linear expansion coefficient greater by two orders of magnitude than that of the solar cell string (silicon), at the time of which any stress that cannot be absorbed by the elasticity of the sealant itself is released by expansion and contraction of the second collector electrodes. When the second collector electrodes made of the second collector electrode material having the characteristics represented by the graph B excessively expand and contract, the conductive powder in contact with each other inside the second collector electrodes are disconnected from each other to increase the resistance of the second collector electrodes themselves, which appears to lead to degradation in performance.

Thus, a suitable material as the second collector electrode material appears to be a material having no significant change in the storage modulus E' of the conductive paste after being cured and further having a reasonably small deformation to the external force in a range of the operating temperature of the solar cell string (approximately −20° C. to 80° C.). Therefore, the second collector electrode material of this embodiment has a viscosity before curing of preferably about 10 to 50 Pa·s (at 25° C., 10 Hz, rheometer measurement), and has a rate of the storage modulus E' after curing of less than 100, preferably less than 20 in the range of −40° C. to 85° C. Use of such a second collector electrode material rearranges the conductive powder at the time of temperature change outdoors, or maintains the relative position of the conductive powder with conductive powder in the front-side bus bar electrodes 32.

Figure 6:
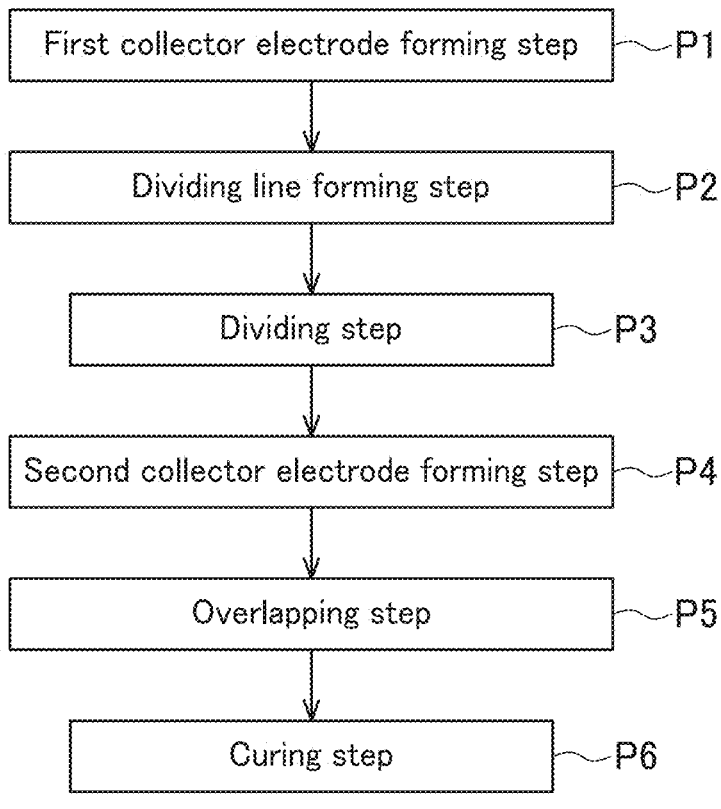
FIG. 6 is a block diagram of a method for producing a solar cell string.

As shown in FIG. 6, a method for producing the solar cell string includes: a first collector electrode forming step P1 of forming a plurality of front-side collector electrodes 3 on the front surface 2A of the semiconductor substrate 2 (see FIG. 1B); a dividing line forming step P2 of forming a plurality of (four) dividing lines R on the semiconductor substrate 2 on which the plurality of front-side collector electrodes 3 are formed (see FIG. 2B); a dividing step P3 of dividing the semiconductor substrate 2 into the plurality of small cell pieces 11 to 15 by cutting the semiconductor substrate 2 along the plurality of (four) dividing lines R (see FIG. 3A); a second collector electrode forming step P4 of forming the back-side collector electrodes 4 by applying the second collector electrode material to the back surfaces 11b to 15b opposite respectively to the front surfaces 11a to 15a of the plurality of divided small cell pieces 11 to 15 and leaving the applied material uncured (see FIG. 3B); an overlapping step P5 of overlapping the front-side bus bar electrode 32 of the front-side collector electrode 3 of one small cell piece 11 with the back-side bus bar electrode 42 of the back-side collector electrode 4 of the other small cell piece 12 of adjacent ones of the plurality of small cell pieces 11 to 15 each having the front-side collector electrode 3 and the back-side collector electrode 4 formed thereon (see FIG. 4A and FIG. 4B); and a curing step P6 of curing the back-side collector electrodes 4 after the overlapping. This configuration eliminates the necessity of disposing a different conductive member from the collector electrode 3 or 4 between the front-side bus bar electrode 32 of the front-side collector electrode 3 and the back-side bus bar electrode 42 of the back-side collector electrode 4, thus achieving excellent productivity. The second resin component for the back-side collector electrodes 4 formed by applying the second collector electrode material and leaving the applied material cured is made of a resin component softer than the first resin component for the front-side collector electrodes 3, whereby each of the cured front-side bus bar electrodes 32 of the front-side collector electrodes 3 bites into each corresponding one of the soft, uncured back-side bus bar electrodes 42 of the back-side collector electrodes 4 (see FIG. 4C), that is, the front-side bus bar electrode 32 of the front-side collector electrode 3 has its end part on the back-side collector electrode 4 side sinking into the back-side bus bar electrode 42 of the back-side collector electrode 4, after the front-side bus bar electrode 32 of the front-side collector electrode 3 is overlapped with the back-side bus bar electrode 42 of the back-side collector electrode 4 as described above (see FIG. 4B). This configuration can increase adhesive force between the front-side bus bar electrode 32 of the front-side collector electrode 3 and the back-side bus bar electrode 42 of the back-side collector electrode 4. For easier understanding of the mutual positional relationship, FIG. 4B and FIG. 4C each schematically show the front-side bus bar electrode 32 of the front-side collector electrode 3 and the back-side bus bar electrode 42 of the back-side collector electrode 4.

In the second collector electrode forming step P4, the back-side finger electrodes 41 and the back-side bus bar electrodes 42 that form the second collector electrodes are formed by applying the conductive metal paste into a desired shape by, for example, screen printing, and leaving the paste uncured (i.e., without being subjected to curing treatment) after the application. The uncured back-side finger electrodes 41 and the uncured back-side bus bar electrodes 42 (i.e., the metal paste applied by, for example, screen printing) are soft, and thus expand along the back surfaces 11b to 15b respectively of the small cell pieces 11 to 15 after being applied to the back surfaces 11b to 15b. Thus, the back-side finger electrodes 41 and the back-side bus bar electrode 42 before being cured have a wide and flat shape (i.e., thin shape) as compared with the front-side finger electrodes 31 and the front-side bus bar electrodes 32 of the front-side collector electrodes 3, respectively.

The first collector electrode forming step P1 includes a step of forming the front-side bus bar electrodes 32 of the front-side collector electrodes 3 on the front surfaces respectively of the plurality of small cell pieces 11 to 15 to be divided, at positions close to one side 2d out of a pair of opposite sides 2c and 2d of the semiconductor substrate 2 opposed to each other in the right-left direction (FIG. 1B); and the second collector electrode forming step P4 includes a step of forming the back-side bus bar electrodes 42 of the back-side collector electrodes 4 on the back surfaces respectively of the plurality of divided small cell pieces 11 to 15, at positions close to an other side 11e out of a pair of opposite sides 11e and 11f opposed to each other in the right-left direction (see FIG. 3B). Further, the overlapping step P5 is a step of overlapping the front-side bus bar electrodes 32 of the front-side collector electrodes 3 with the back-side bus bar electrodes 42 of the back-side collector electrodes 4 (see FIG. 4A to FIG. 4C).

To describe the steps of the method for producing the solar cell string, the semiconductor substrate 2 shown in FIG. 1A is prepared, and the front-side finger electrodes 31 and the front-side bus bar electrodes 32 are formed on the respective segments obtained by dividing the front surface of the semiconductor substrate 2 into five equal parts in the right-left direction. The front-side finger electrodes 31 and the front-side bus bar electrodes 32 are formed by applying a conductive metal paste in a desired shape by, for example, screen printing, followed by being fired in a furnace for curing. For the first resin material of the metal paste, it is desired to use a thermosetting epoxy resin being a hard resin to achieve both thinner electrodes and an increased adhesiveness of the electrodes.

Figure 2A:
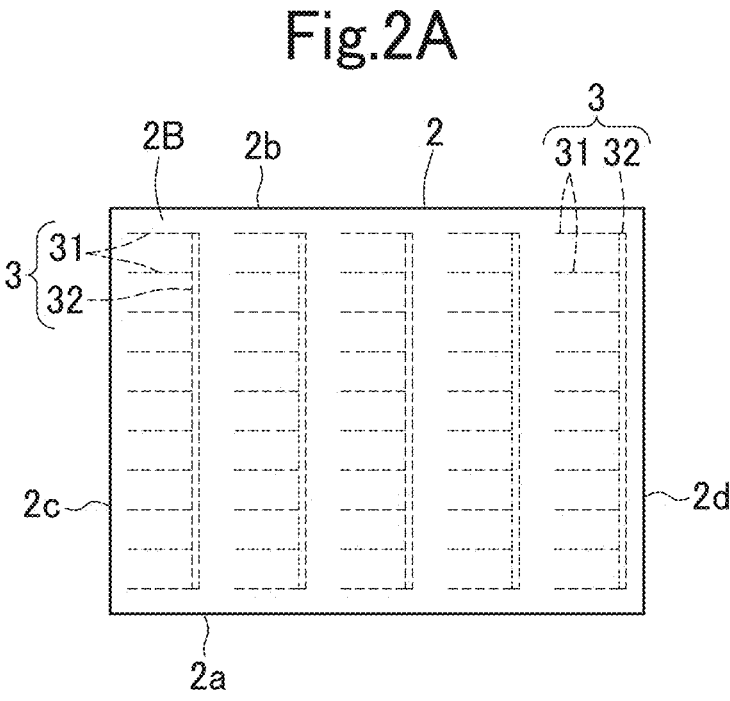
FIG. 2A is a bottom view of the semiconductor substrate of FIG. 1B.
Figure 2B:
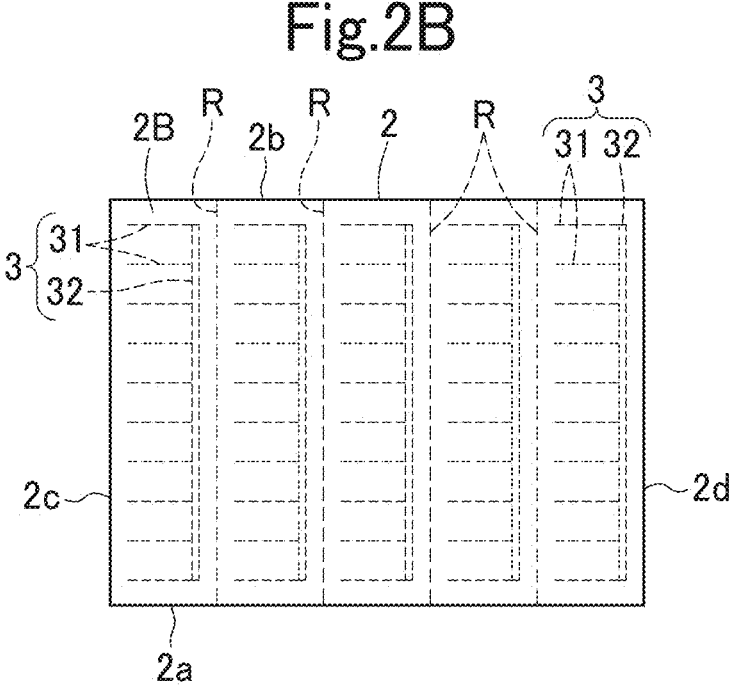
FIG. 2B is a bottom view of the semiconductor substrate of FIG. 2A with its other surface having scribe lines formed thereon.

Next, as shown in FIG. 2A, the semiconductor substrate 2 is turned upside down so that the back surface 2B of the semiconductor substrate 2 faces on an upper side of the paper surface. Then, as shown in FIG. 2B, the dividing lines R for dividing the semiconductor substrate 2 into the five segments are formed by irradiating the semiconductor substrate 2 with laser beam. The semiconductor substrate 2 is thus repeatedly irradiated with laser beam while being cooled to be thereby capable of being cut into the five small cell pieces 11 to 15 (see FIG. 3A). The dividing lines R are linear grooves substantially parallel to the left and right sides 2c, 2d of the semiconductor substrate 2. In this embodiment, the semiconductor substrate 2 is cut by laser beam, but the configuration can be such that the dividing lines R are formed on the semiconductor substrate 2 by laser beam, and the semiconductor substrate 2 is bent and separated by being applied with load along the dividing lines R.

Next, the separated five small cell pieces 11 to 15 are assembled together (disposed with no gaps therebetween), and then the back-side finger electrodes 41 and the back-side bus bar electrodes 42 are formed on the back surfaces 11b to 15b respectively of the small cell pieces 11 to 15, in a manner similar to the electrodes on the front surfaces (see FIG. 3B). In this case, the front-side bus bar electrode 32 and the back-side bus bar electrode 42 differ from each other in that the front-side bus bar electrode 32 is formed, for example, at a position close to the right side 11f of the left end small cell piece 11 while the back-side bus bar electrode 42 is formed, for example, at a position close to the left side 11e of the left end small cell piece 11 (see FIG. 3B). That is, the front-side bus bar electrode 32 and the back-side bus bar electrode 42 are formed respectively at one end (right end 11f of the small cell piece 11) and the other end (left end 11e of the small cell piece 11) in the right-left direction within the segment, and are formed at different positions in the right-left direction. The configuration can be such that the assembled five small cell pieces 11 to 15 are fixed with each other using, for example, a removable tape to prevent the small cell pieces 11 to 15 from moving so that the back-side finger electrodes 41 and the back-side bus bar electrodes 42 are easily formed. The same applies to the remaining small cell pieces 12 to 15, the description of which will be omitted.

Figure 4B:
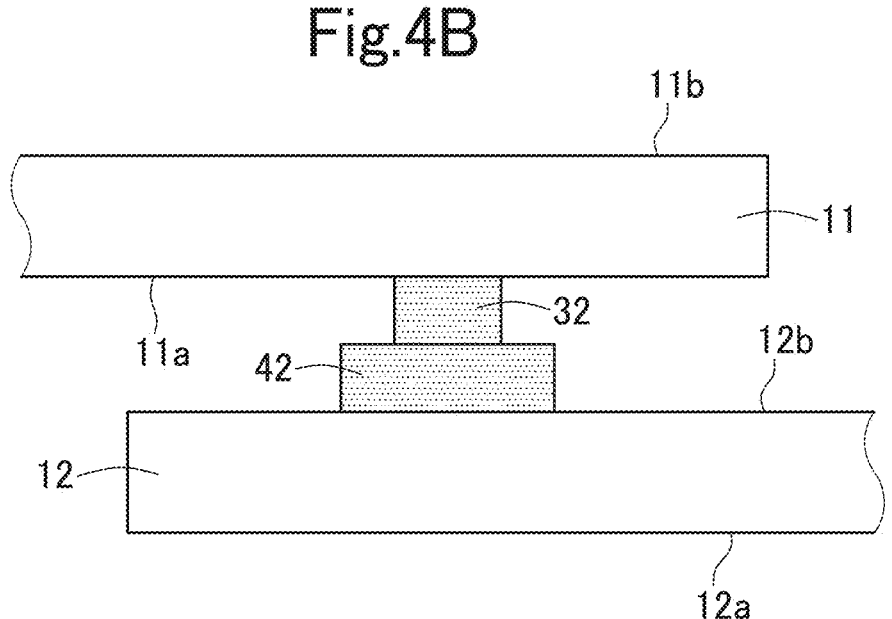
FIG. 4B is an enlarged view of an essential part showing a portion where the collector electrodes are connected to each other.
Figure 4C:
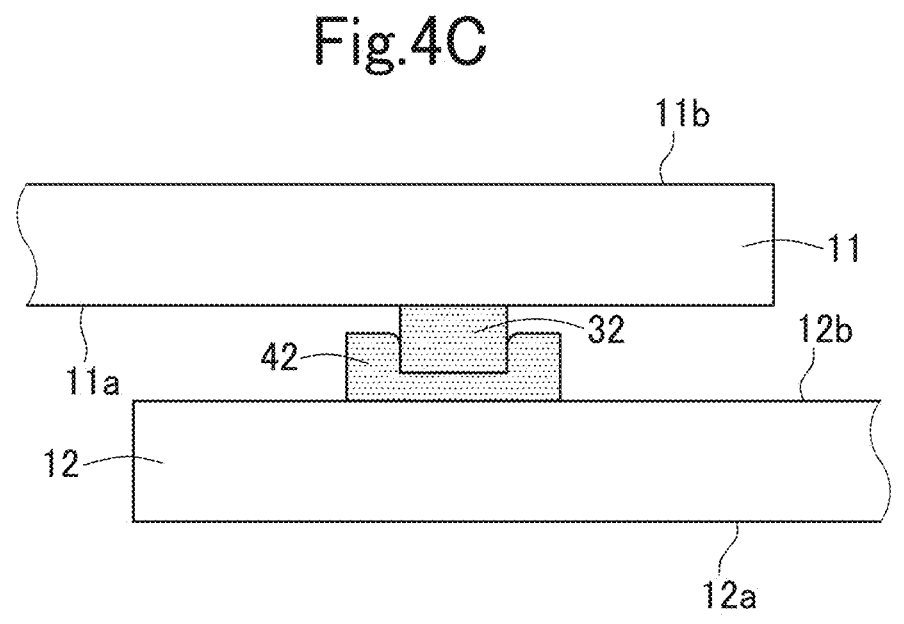
Figure 7:
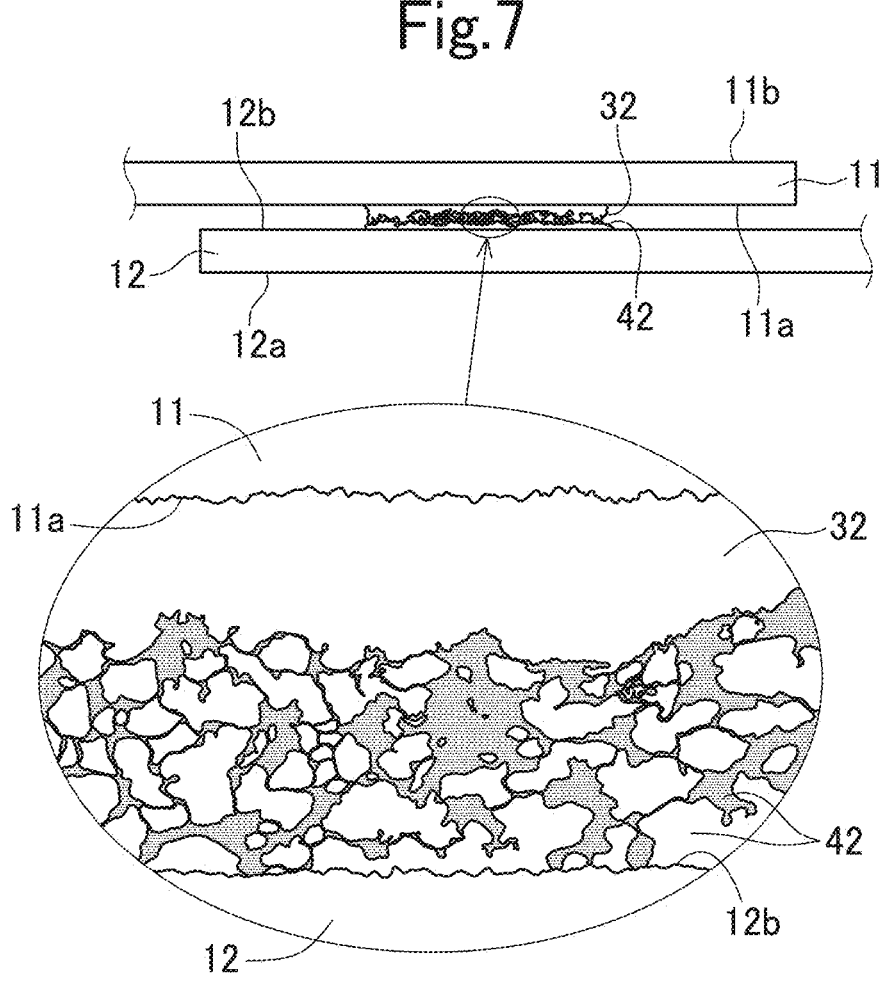
FIG. 7 is a view for explaining a connection state between a first conductive electrode and a second conductive electrode.

As shown in FIG. 4A to FIG. 4C, while the five small cell pieces 11 to 15 have their back surfaces 11b to 15b directed upward, the small cell piece 11 on the upper side is placed on the small cell piece 12 on the lower side in a shingling manner so that the front-side bus bar electrode (illustrated only in FIG. 4B) 32 directed downward and positioned at the right end of the front surface 11a of the small cell piece 11 on the upper side overlaps the back-side bus bar electrode 42 directed upward and positioned at the left end of the back surface 12b of the small cell piece 12 on the lower side. In this case, since the back-side bus bar electrode 42 is not cured (i.e., is soft), the cured front-side bus bar electrode 32 easily bites into the back-side bus bar electrode 42 (see FIG. 4C) to allow both electrodes to firmly and closely adhere to each other. In so doing, the surface of the front-side bus bar electrode 32 has specific surface roughness (minute unevenness), and the back-side bus bar electrode 42 having sufficient softness is formed into such a shape as to conform to the surface roughness of the front-side bus bar electrode 32, i.e., intrudes into minute recesses in the surface to thereby more firmly and closely adhere to the front-side bus bar electrode 32 (see FIG. 7). In a connection portion between the front-side bus bar electrode 32 and the back-side bus bar electrode 42 in FIG. 7, the dotted area shows the second resin component of the back-side bus bar electrode 42.

After the overlapping of all the five small cell pieces 11 to 15 is completed, these small cell pieces 11 to 15 are fired in a firing furnace so that the back-side finger electrodes 41 and the back-side bus bar electrodes 42 are cured to join the front-side bus bar electrode 32 and the back-side bus bar electrode 42 together. All of the small cell pieces 11 to 15 are thereby electrically connected to each other in series (this is called shingling connection). Even in the state where the back-side finger electrodes 41 and the back-side bus bar electrode 42 are cured by firing, the front-side bus bar electrode 32 still bites into the corresponding back-side bus bar electrode 42 (see FIG. 4C). The back-side bus bar electrode 42 even in the cured state still intrudes into minute recesses in the surface of the front-side bus bar electrode 32 (see the enlarged view of FIG. 7). The biting of the front-side bus bar electrode 32 into the back-side bus bar electrode 42 and the intrusion of the back-side bus bar electrode 42 into the minute recesses of the surface in the front-side bus bar electrode 32 allow the front-side bus bar electrode 32 and the back-side bus bar electrode 42 to firmly and closely adhere to each other. That is, this configuration can secure sufficient adhesive force in the adhesion between the front-side bus bar electrode 32 and the back-side bus bar electrode 42.

The connection between the small cell pieces 11 to 15, specifically, the connection between the front-side bus bar electrodes 32 and the back-side bus bar electrodes 42 as in this embodiment is particularly effective for shingling connection using silicon hetero-junction cells.

After the connection, the small cell pieces 11 to 15 are turned upside down to have the front surfaces 11a to 15a facing upward, and are disposed between the front-side protective member (not shown) positioned above and the back-side protective member (not shown) positioned below and sealed using the sealant resin (not shown) to thereby obtain the completed solar cell string 5. The solar cell string 5 thus configured to have the plurality of small cell pieces 11 to 15 connected to each other can increase output per unit area. Since, in this embodiment, the uncured back-side bus bar electrodes 42 are placed to be directed upward for connection, the back-side bus bar electrodes 42 are suppressed from being deformed by drooping, which occurs when the back-side bus bar electrodes 42 are placed to be directed downward for connection.

Figure 8:
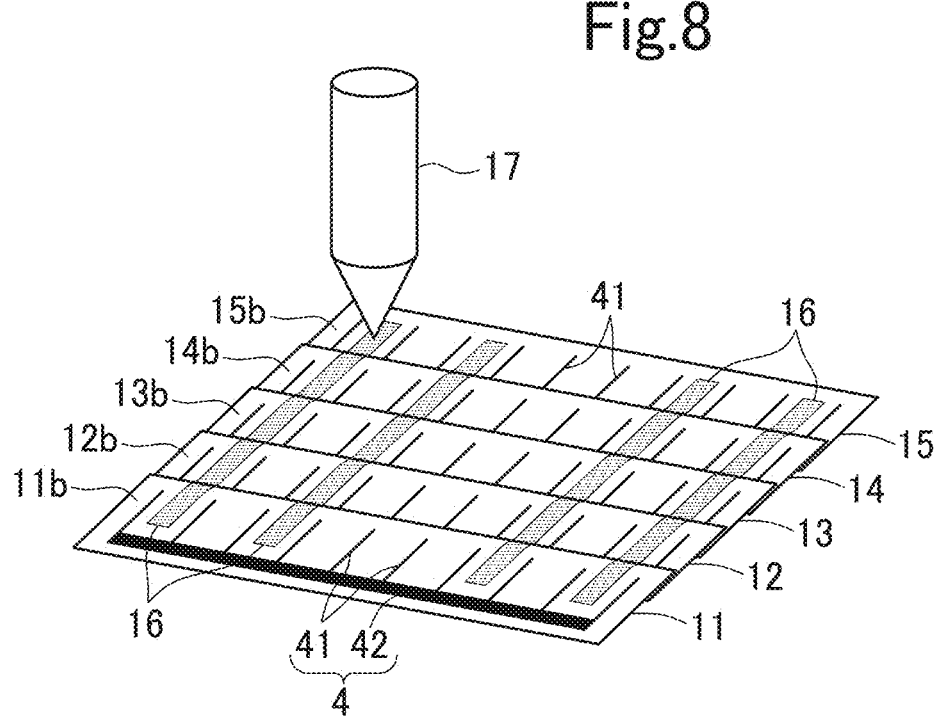
FIG. 8 is a perspective view showing another embodiment, the view showing a state where a transparent resin is disposed in a tape shape by a dispenser on an upper surface of a solar cell string formed of five small cell pieces overlapping each other.

The present invention further includes a step (not shown) of attaching a transparent synthetic resin to the plurality of overlapped small cell pieces 11 to 15 before curing the second collector electrode material, so as to extend over these small cell pieces. Specifically, as shown in FIG. 8, the configuration can be such that a transparent synthetic resin (thermosetting resin, e.g., acrylic resin) 16 is attached in a tape shape (or a thread shape) to the back surfaces 11b to 15b of the small cell pieces 11 to 15 using, for example, a dispenser 17 so as to extend over all the five small cell pieces 11 to 15 after the overlapping of all the small cell pieces 11 to 15 is completed and before curing the back-side collector electrodes 4. Thereafter, the small cell pieces 11 to 15 are fired in a firing furnace to cause the synthetic resin (thermosetting resin) 16 to be thermally cured for reinforced connection between the small cell pieces, which is preferable. In FIG. 6, the synthetic resin is attached to four locations, but the configuration can be such that the synthetic resin is attached to only one location, or two, three, or five or more given number of locations.

It is a matter of course that the present invention is not limited to the aforementioned embodiment, but various modifications can be made without departing from the gist of the present invention.

The aforementioned embodiment has been described by taking, for example, the case where both the back-side finger electrodes 41 and the back-side bus bar electrodes 42 of the back-side collector electrodes 4 are left uncured after being applied, but the configuration can be such that the back-side finger electrodes 41 are subjected to curing treatment and only the back-side bus bar electrodes 42 are left uncured.

The present invention has been appropriately and sufficiently described as above through embodiments with reference to the drawings in order to express the present invention, but those skilled in the art shall recognize that modifications and/or improvements of the above embodiments could be easily achieved. Therefore, any modified embodiments or improved embodiments implemented by those skilled in the art shall be construed as being covered by the scope of claims as claimed in CLAIMS, unless such modified embodiments or improved embodiments depart from the scope of the claims.

Reference Signs List

2: Semiconductor substrate
2A: Front surface (one surface)

14

2B: Back surface (other surface)
2a, 2b, 2c, 2d: Side
3: Front-side collector electrode (first collector electrode)
4: Back-side collector electrode (second collector electrode)
5: Solar cell string
11-15: Small cell piece
11a-15a: Front surface
11b-15b: Back surface
11c-11f: Side
16: Synthetic resin (thermosetting resin)
17: Dispenser
31: Front-side finger electrode
32: Front-side bus bar electrode
41: Back-side finger electrode
42: Back-side bus bar electrode
P1: First collector electrode forming step
P2: Dividing line forming step
P3: Dividing step
P4: Second collector electrode forming step
P5: Overlapping step
P6: Curing step
R: Dividing line (scribe line)

The invention claimed is:

1. A method for producing a solar cell string, the method comprising:

preparing a plurality of small cell pieces by forming a first collector electrode by applying a first collector electrode material comprising a first metal component and a first resin component to one surface of a semiconductor substrate and curing the first collector electrode material, and forming a second collector electrode by applying a second collector electrode material comprising a second metal component and a second resin component softer than the first resin component to an other surface of the semiconductor substrate and leaving the second collector electrode material uncured; and curing the second collector electrode material after each two adjacent ones of the plurality of small cell pieces are partially overlapped with each other to allow the first collector electrode of one of each two adjacent small cell pieces to overlap the second collector electrode of an other one of each two adjacent small cell pieces.

2. The method for producing the solar cell string according to claim 1, the method further comprising: forming a plurality of the first collector electrodes on the one surface of the semiconductor substrate;

forming at least one dividing line on the semiconductor substrate on which the plurality of first collector electrodes are formed;

dividing the semiconductor substrate into the plurality of small cell pieces by cutting the semiconductor substrate along the at least one dividing line;

forming the second collector electrode on the other surface opposite to the one surface of each of the plurality of small cell pieces formed by the dividing, the one surface having a corresponding one of the plurality of first collector electrodes formed thereon;

overlapping the first collector electrode of the one of each two adjacent small cell pieces with the second collector electrode of the other one of each two adjacent small cell pieces out of the plurality of small cell pieces each having the first collector electrode and the second collector electrode formed thereon; and curing the second collector electrode material after the overlapping.

3. The method for producing the solar cell string according to claim 2, wherein the semiconductor substrate has a substantially quadrangular shape having a pair of opposite sides, the at least one dividing line is a linear groove formed substantially parallel to the pair of opposite sides of the semiconductor substrate, each of the first collector electrode and the second collector electrode comprises a bus bar electrode, the forming of the plurality of first collector electrodes comprises forming the bus bar electrode of each of the plurality of first collector electrodes on the one surface of each of the plurality of small cell pieces to be divided, at a position close to one side of the pair of opposite sides, the forming of the second collector electrode comprises forming the bus bar electrode of the second collector electrode on the other surface of each of the plurality of divided small cell pieces, at a position close to an other one side opposite to the one side of the pair of opposite sides, and the overlapping of the first collector electrode with the second collector electrode is overlapping of the bus bar electrode of the first collector electrode with the bus bar electrode of the second collector electrode.

4. The method for producing the solar cell string according to claim 1, wherein the first collector electrode is formed to have a substantially linear shape on a front surface being a light-receiving surface of the semiconductor substrate, the first resin component of the first collector electrode material comprises an epoxy resin as a main component, the second collector electrode is formed to have a substantially linear shape on a back surface opposite to the light-receiving surface of the semiconductor substrate, the second resin component of the second collector electrode material comprises an acrylic resin as a main component, and the first collector electrode has a line width smaller than the line width of the second collector electrode.

5. The method for producing the solar cell string according to claim 1, the method further comprising: attaching a transparent synthetic resin to the plurality of overlapped small cell pieces before curing the second collector electrode material, so as to extend over the plurality of small cell pieces.

* * * * *